(12) United States Patent
Cain et al.

(10) Patent No.: US 6,886,798 B2
(45) Date of Patent: May 3, 2005

(54) SUPPORT FOR ELECTRONICS ASSEMBLY

(75) Inventors: Matthew C. Cain, Sunnyvale, CA (US); Jay Kevin Osborn, Crowthorne (GB); John David Schnabel, Fareham (GB); Denise Silverman, San Carlos, CA (US); Andrew John Yair, Swindon (GB)

(73) Assignee: Sun Microsystems, Inc., Santa Clara, CA (US)

( * ) Notice: Subject to any disclaimer, the term of this patent is extended or adjusted under 35 U.S.C. 154(b) by 105 days.

(21) Appl. No.: 10/166,520

(22) Filed: Jun. 10, 2002

(65) Prior Publication Data

US 2003/0226949 A1 Dec. 11, 2003

(51) Int. Cl.⁷ .............................................. F16M 13/00
(52) U.S. Cl. ..................................................... 248/603
(58) Field of Search ................................ 248/638, 603, 248/678, 618, 621

(56) References Cited

U.S. PATENT DOCUMENTS

| | | | |
|---|---|---|---|
| 2,957,668 A | * 10/1960 | Norquist et al. | ............. 108/51.3 |
| 4,914,552 A | 4/1990 | Keemer | |
| 4,974,377 A | 12/1990 | Dominitz et al. | |
| 5,100,096 A | * 3/1992 | Mizuno et al. | ............. 248/638 |
| 5,145,243 A | 9/1992 | Liu | |
| 5,189,277 A | 2/1993 | Boisvert et al. | |
| 5,333,830 A | * 8/1994 | Millen | ............. 248/679 |
| 5,394,305 A | 2/1995 | Moral et al. | |
| 5,644,991 A | 7/1997 | Prevot et al. | |
| 5,734,561 A | 3/1998 | Wolf et al. | |
| 5,741,985 A | 4/1998 | Gaete | |
| 5,758,855 A | * 6/1998 | Jordan et al. | ............ 248/346.01 |
| 5,914,864 A | 6/1999 | MacDonald et al. | |
| 5,973,926 A | 10/1999 | Sacherman et al. | |
| 5,996,960 A | * 12/1999 | Krajec | ........................ 248/638 |
| 6,129,327 A | * 10/2000 | Dubois | ...................... 248/634 |
| 6,227,515 B1 | * 5/2001 | Broyles | ...................... 248/678 |
| 6,510,055 B1 | 1/2003 | Liu et al. | |
| 2002/0112653 A1 | * 8/2002 | Moore et al. | ............ 108/57.25 |

FOREIGN PATENT DOCUMENTS

| | | |
|---|---|---|
| EP | 11988678 | 3/2002 |
| JP | 2000-151137 | 5/2000 |
| JP | 2002-145267 | 5/2002 |
| JP | 2002-145269 | 5/2002 |

* cited by examiner

Primary Examiner—Leslie A. Braun
Assistant Examiner—Kofi Schulterbrandt
(74) Attorney, Agent, or Firm—Meyertons Hood Kivlin Kowert & Goetzel, P.C.; B. Noël Kivlin

(57) ABSTRACT

A support for holding an electronics assembly, comprises:
(i) a rigid frame (6) that can be secured to the assembly;
(ii) one or more cushioning elements (8) for protecting an electronics assembly held by the support against mechanical shocks during handling; and
(iii) a plurality of handles (16) to enable the support to be manually lifted.

The handles may be employed to lift both the assembly and the support, or they may be used to release the support from the assembly once the assembly is in place in an electronics cabinet. The support protects the assembly during installation in data centres after other packing materials have been discarded.

10 Claims, 5 Drawing Sheets

SUPPORT FOR ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such assemblies are shipped from their manufacturing location to the end users, where they are installed, typically in a nineteen inch rack in a data centre. The assemblies need mechanical protection during shipping and transportation to their final destination, and are therefore securely packaged, normally being supported on a wooden pallet in a box or other container and employing standard packaging materials such as foam rubber or expanded polystyrene.

However, such packaging materials have a limited lifespan, normally lasting only a single shipping and installation process, after which they are discarded. More importantly, many packaging materials will generate dust and other contaminants when handled, with the result that many organisations do not allow such materials in the data centres. This has the result that the assemblies must be removed from the packaging outside the data centre and only after the removal can they be moved into the data centre. Thus, the assemblies are completely unprotected at a time when they may be most prone to damage by being knocked or dropped.

SUMMARY OF THE INVENTION

According to one aspect, the present invention provides a support for holding and handling an electronics assembly, which comprises:
(i) a rigid frame that can be secured to the assembly;
(ii) one or more cushioning elements for protecting an electronics assembly held by the support against mechanical shocks during transport and handling; and
(iii) a plurality of handles to enable the electronics and the support to be manually lifted.

The support will normally be made principally from metal or other durable, reusable material that will not release contaminants, so that it can accompany the electronics assembly up to its final location, and therefore provide protection to the assembly at all times when it is being moved and is therefore vulnerable.

The frame can, if desired, simply be provided with one or more cushioning elements, for example made from a tough resiliently deformable material such as vulcanised rubber, neoprene etc., which provide a base for the support and which will rest on the floor or ground. Alternatively, the support may include a rigid base, formed for example from the same material as the rigid frame, that is attached to the or each cushioning element so that the frame is cushioned from shocks to the base by the cushioning elements. Thus, according to another aspect, the invention provides a support for holding an electronics assembly, which comprises a rigid frame that can be secured to the assembly, one or more cushioning elements for protecting an electronics assembly held by the support against mechanical shocks during handling, and a rigid base that is attached to the or each cushioning element so that the frame is cushioned from shocks to the base.

The support may, for example be a generally flat article upon which the electronics assembly is positioned, in which case the frame and the base may each be in the form of a flat, generally rectangular structure, that is separated from the other by a number of separate, discrete cushioning elements, for example in each corner thereof.

The support may include attachment elements for securing the support to the electronics assembly so that the assembly cannot inadvertently be dislodged from the support during handling, and so that the assembly and the support can be handled as a single item. Where attachment elements are provided, they may be located anywhere on the support, but are conveniently provided in the region of the handles. The handles may, according to one aspect, be movable with respect to the frame in order to allow the electronics assembly to be engaged or released. This may be achieved in a number of ways. For example, it is possible for the handles to pivot and/or slide, at least to a limited extent, between positions in which they secure or release the assembly to the support. Such an arrangement enables the support to be released from the assembly with relative ease, and also enables the support to be held manually by the installers at the instant at which it is released from the electronics assembly so that it is relatively unlikely that the support will be allowed to fall and cause any damage either to itself or to any other equipment located beneath it or injury to the operator. The handles may be movable with respect to the support in any of a number of ways. For example, separate handles may be provided on either side of the support that are pivotal either in a vertical or horizontal axis and which may be twisted to release the assembly while still holding the handles. Alternatively, the support may be arranged so that the handles on either side thereof may be pulled apart in order to release the assembly. For example, the handles may be slidable with respect to the assembly, or they may each be pivotal about one of two parallel axes, one on each side of the support.

The electronics assembly can therefore be moved into its location within the data centre, either manually or with the aid of equipment, and fixed in position, for example in a racking system, while still attached to the support so that it is still protected to some extent against damage due to mishandling. Only when the electronics assembly is safely installed in position is it necessary to remove the support, so that it is protected by the support at all times during movement thereof.

Thus, according to yet another aspect, the invention provides a method of installation of an electronics assembly in a location, which comprises:
(i) providing the assembly on a support which comprises a rigid frame that is secured to the assembly and one or more cushioning elements for protecting the electronics assembly against mechanical shocks during handling, and a plurality of handles to enable the support to be manually lifted;
(ii) moving the assembly to the location while it is secured to the frame and fixing the assembly in position so that the frame depends from the assembly;
(iii) releasing securement of the frame from the assembly; and
(iv) removing the frame.

The assembly can, in principle, be moved manually to the location, for example a racking system, where it will operate, although this may, in practice, be difficult in many instances due to the weight of the assembly. For example an assembly for use as a telecoms or internet server may typically weigh between 100 and 120 kg, so that it may be more convenient to employ equipment such as a fork lift truck or a movable platform to locate and secure the assembly in the rack. Similarly, once the frame assembly has been fixed in position, for example in a racking cabinet, so that the support is itself supported by the assembly, it can be released from the assembly and removed either manually or mechanically. Although there is no reason to remove it mechanically because of its weight, if any mechanical device such as a platform is already in place, it may be simpler to employ it even though it is not necessary to do so.

As stated above, the attachment elements may be located in the region of the handles, and may engage and disengage the electronics assembly by movement of the handles. The assembly may, for instance, be provided with lugs, usually on the chassis thereof, on which the support is secured, and from which the support can depend when the attachment elements are released. Where lugs are provided on the chassis of the assembly, once the assembly has been located in the racking system and is supported thereby, the attachment elements can be loosened so that the support still depends from, and is supported by, the assembly, but is not secured thereto. The support may then be completely removed from the assembly simply by grasping and moving the handles to pull them off the lugs.

The principal purpose of the support is to provide a rigid frame that will protect the edges and/or corners of the electronics assembly against damage due to dropping, knocking or other impacts. The frame of the support may also be provided with a protective shield, at least in the central region thereof, to protect the electronics assembly against impact. Electronics assemblies that are employed in racking systems are often designed to be supported in operation not from their base, but instead from their sides on telescopic arms. In order to reduce the height of the assemblies and so maximise the useful volume within the rack, and also to reduce the weight of the assembly, the lower surface of such assemblies can be relatively weak and liable to puncture or other damage if dropped even a small distance. Accordingly, the frame, and/or the base, may be provided with a protective steel shield extending across at least the central region thereof.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
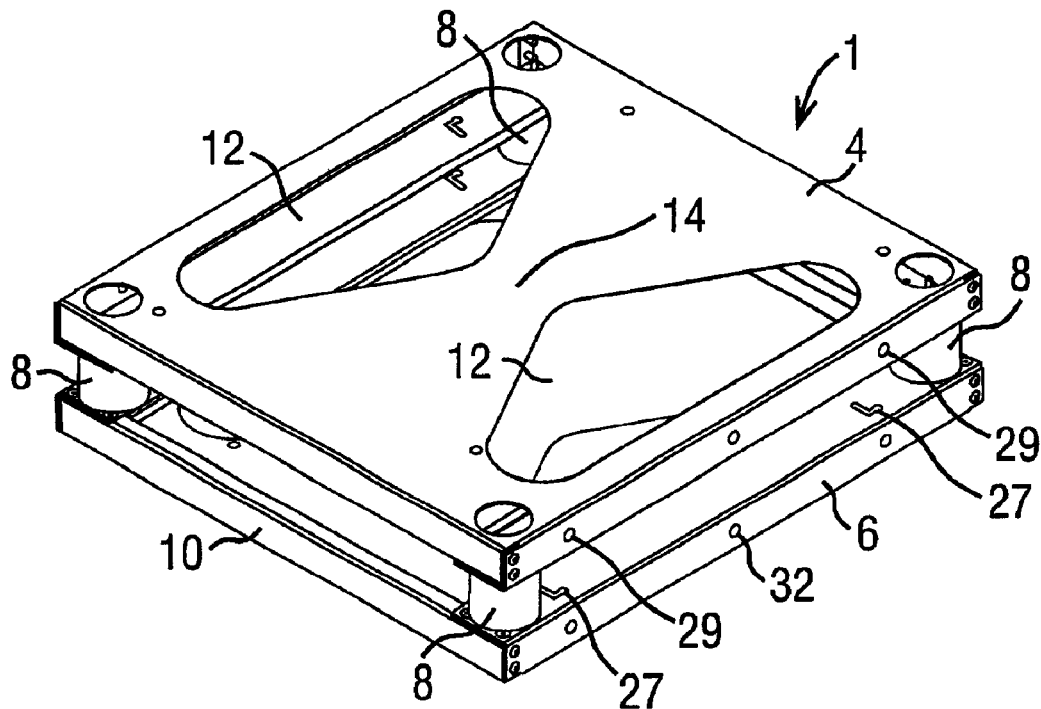
FIG. 1 is an isometric view of a support according to one embodiment of the present invention.

Referring now to the drawings, in which like reference numerals are used to designate corresponding elements, FIG. 1 shows a support 1 for an electronics assembly 2 that will be employed as a server in a nineteen inch rack in a data centre.

The support comprises a rectangular frame 4 for supporting the electronics assembly 2, and a base 6 on which the frame 4 is supported by means of four cushioning legs 8 formed from vulcanised rubber or other tough, resiliently deformable material. The frame 4 and the base 6 can be of generally the same size and shape, and in the embodiment shown in FIG. 1 are of identical design to one another. The frame 4 and base 6 are each formed from a sheet of steel that is pressed into closed struts 10 extending along each edge thereof to give the whole structure a degree of rigidity. The sheet of steel has a pair of apertures 12 cut therein in order to reduce the weight of the support, but the steel sheet forming the frame and the base extends across the central region 14 thereof. The legs 8 are each approximately 4 to 5 cm in length, and can be compressed by up to about 20 to 30 mm during handling in addition to allowing the frame and the base to move up to about 5 mm or more laterally with respect to one another.

The support may be formed from any material that has the required strength and does not comprise a fibrous material. For example the support may be formed from steel or other material, e.g. aluminium, or from a plastics material.

Figure 2A:
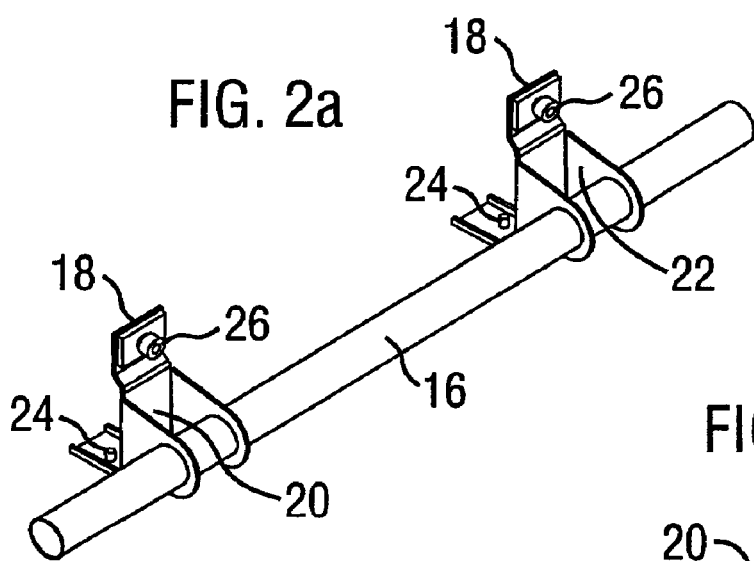
FIGS. 2a and 2b is a view of a handle that is employed with the support of FIG. 1.
Figure 2B:
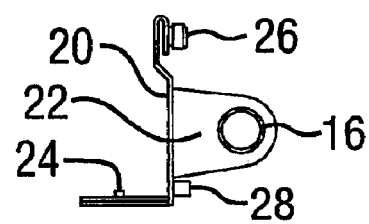

The support is provided with a detachable, generally horizontal tubular handle 16 as shown in FIG. 2a and FIG. 2b extending along each of two opposite sides of the frame 4. Each handle 16 is provided with a pair of brackets 18, each of which has a substantially "L"-shaped body 20 and a pair of arms 22 that have been folded so as to be in parallel planes, and have holes into which the tubular handles are inserted and welded in position. Each bracket has a pin 24 in the horizontal part of thereof that can be received by an "L"-shaped keyhole slot 27 in the under surface of struts 10 on opposite sides of the frame, and two captive screws 26 and 28, one located above the tubular handle 16 on the upper part of the bracket 18, and the other below the handle 16.

Figure 3:
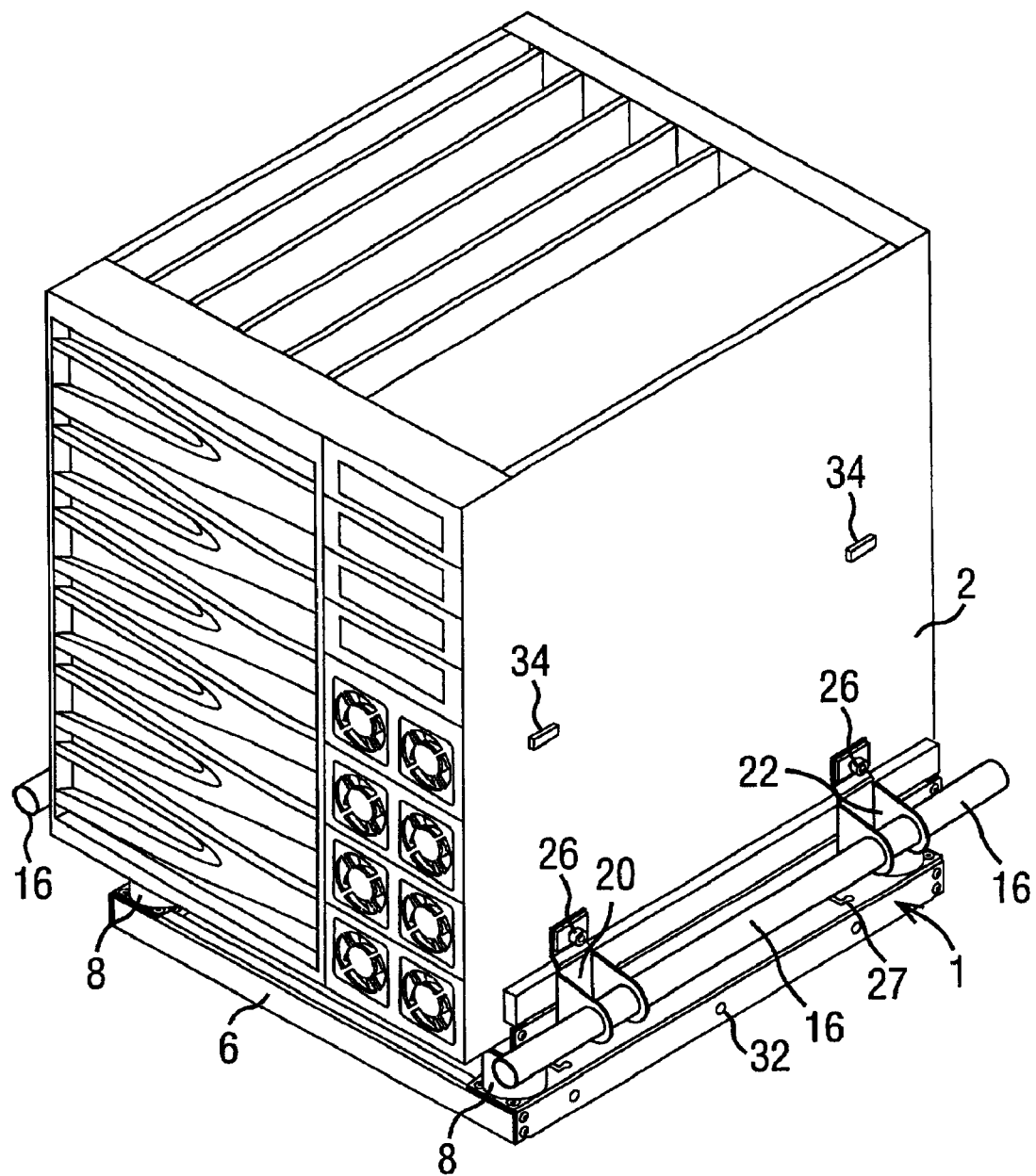
FIG. 3 is an isometric view of the support of FIG. 1 with an electronics assembly thereon.

In operation, an electronics assembly is located on, and supported by, the frame 4 of the support, and is secured thereto by the brackets 18 of the handles 16 as shown in FIG. 3. The handles are placed against the frame 4 and the assembly 2 so that the pins 24 on the horizontal arms of the brackets 18 are received in the keyhole 27 on the under surface of the struts 10. The pins 24 are received by the enlarged end of the keyhole slots 27, so that the handles 16 can be slid in a direction parallel to the edges of the frame and can then both be pushed toward the frame (and assembly) so that the pin 24 is located in that part of the keyhole slot perpendicular to the edge of the support. The captive screw 28 can then be tightened in hole 29 on the outer edge of the frame. In addition, captive screw 26 is engaged on a short lug 30, two of which extend from each of the two opposite sides of the chassis of the electronics assembly 2. Once the electronics assembly has been positioned on, and secured to, the support 1, is can be placed on a wooden pallet and secured thereto by means of bolts (not shown) that are received in holes 32 in the base. The assembly is then located in a cardboard box and is packed with conventional packing materials such as foam rubber and expanded polystyrene. The assembly so packaged can then be shipped and transported to the customer's data centre.

Figure 4:
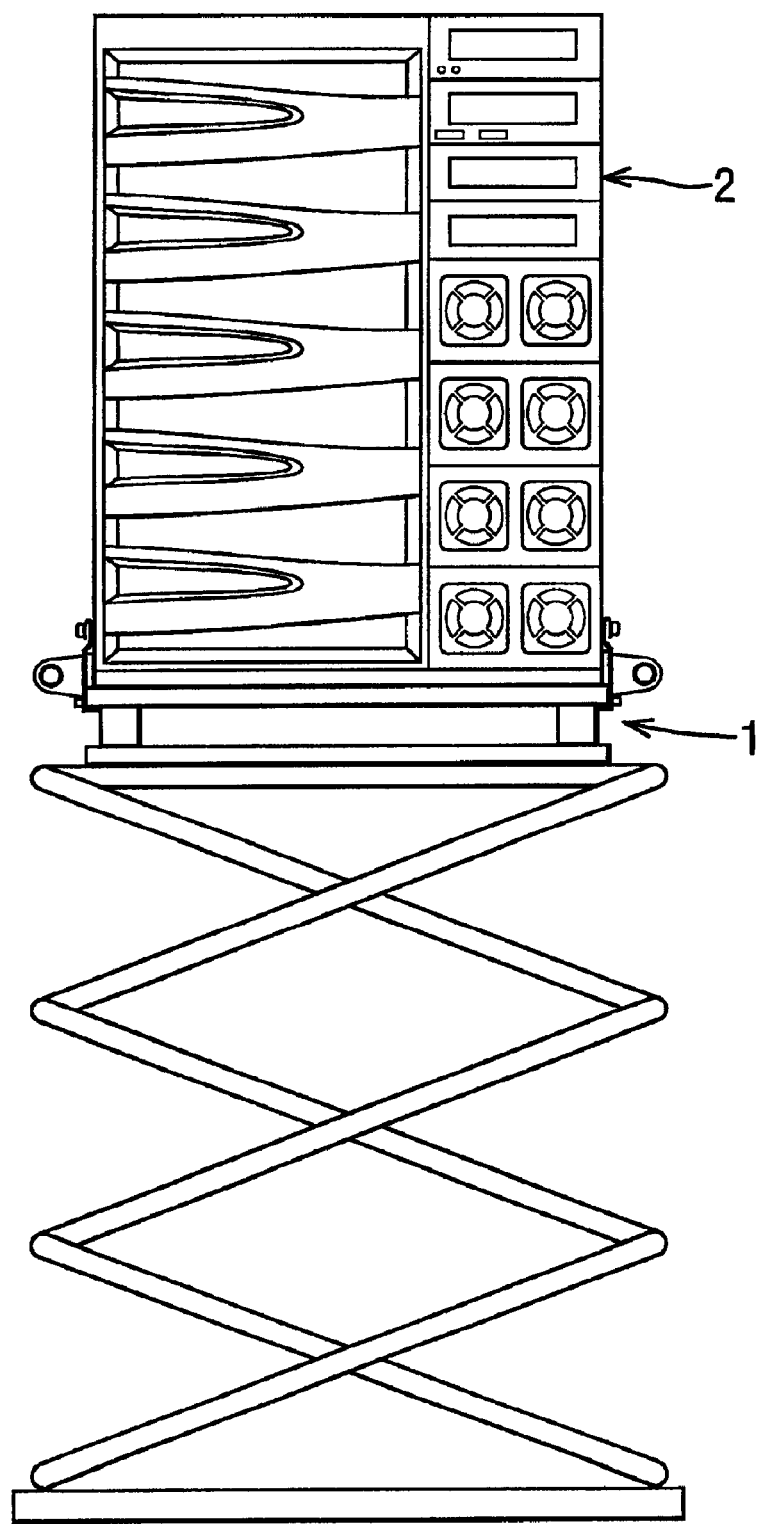
FIG. 4 is a front view of the assembly and support of FIG. 3 being moved into position.

Once at the data centre, but in a region thereof insensitive to contamination, the box and packing can be removed and discarded if desired, the bolt located in hole 32 that secures the support to the pallet can be removed, and the support can be lifted from the pallet either manually by use of handles 16, or by means of a fork lift truck. If the support includes a base 6 in addition to the frame 4, the forks of the fork-lift truck can be inserted between the frame and the base, with the result that the assembly can neither tip off nor slide off the forks. The assembly can then be moved to its final location, for example in a nineteen inch rack, or other sized rack. FIG. 4 shows this operation being performed. It may be conducted by raising the support on a movable platform until supports 34 are correctly positioned with respect to telescopic arms that can extend out from the rack.

Figure 5:
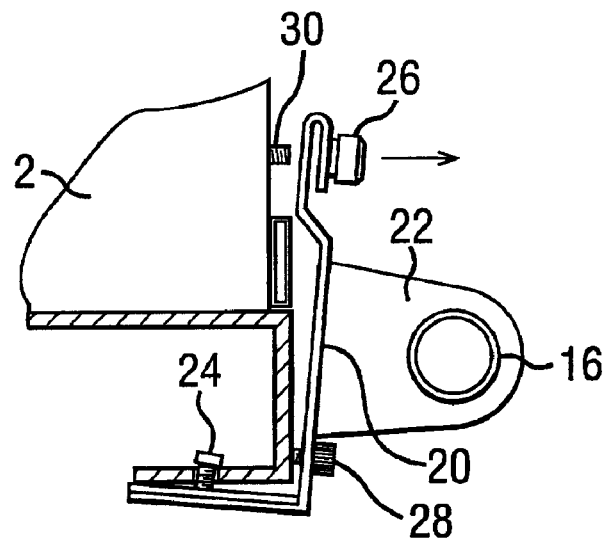
FIG. 5 is a side view of the assembly and support shown in FIGS. 2 and 3 showing release of the assembly.

When the assembly is mounted on the telescopic arms, it is in its final position, and the support 1 is no longer necessary and can be removed. In order to do this, captive screws 26 and 28 are first loosened from both handles. The electronics assembly is now no longer secured to the support, but the two remain together because the lugs 30 are still received in holes at the top of the brackets 18 in which the captive screws 26 are located, and the weight of the support 1 depending from the lugs 30 on the chassis of the assembly tend to pull the top part of the brackets toward the chassis. The handles 16 may then simply be pulled in opposite directions, as shown by the arrow, in order to pull them off the lugs 30 ands release the chassis from the support as shown in FIG. 5. In this operation the bracket 20 pivots about the pin 24, and the captive screw 28 slides out of the hole 29. The pin 24 can also be caused slide along that part of the keyhole slot perpendicular to the edge of the support. The support can then either be lowered manually or by means of the platform.

Figure 6:
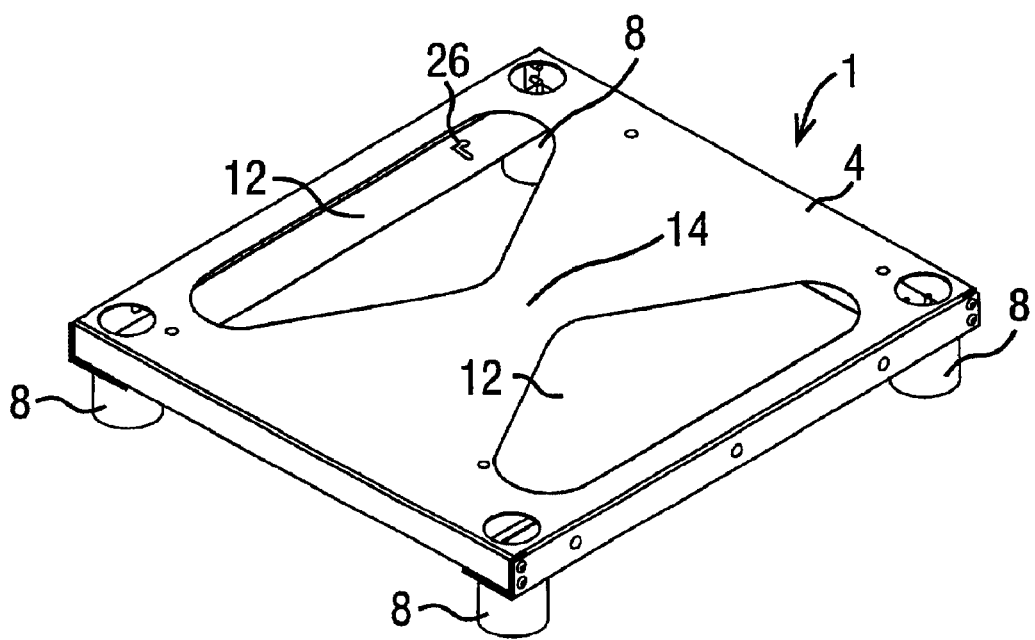
FIG. 6 is an isometric view of a support according to another aspect of the invention.

Another form of support is shown in FIG. 6. This form of support is the same as that shown above with reference to FIGS. 1 to 4 with the exception that the support does not include a base 6. According to this embodiment, the cushioning legs 8 are located directly on the ground or on the pallet during shipping.

Figure 7:
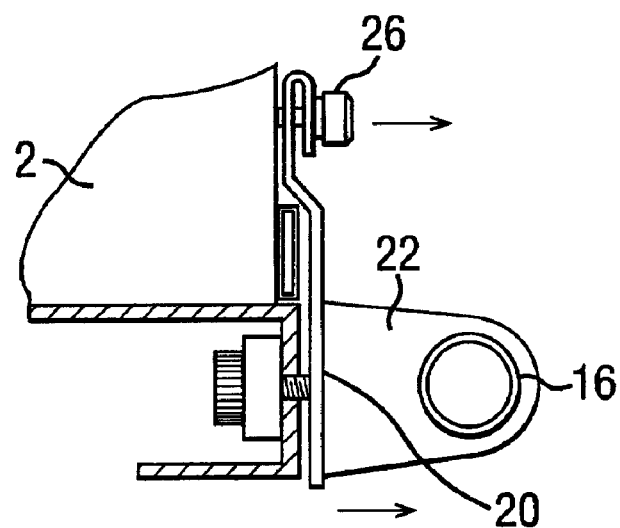
FIG. 7 is a cross-section through yet another embodiment of the invention.

FIG. 7 shows a modification of the support shown in FIGS. 1 to 6. In this embodiment, the handles 16 can be pulled away from the assembly 2 to release it, but the handles do not pivot. Instead they slide out of engagement as shown by the arrows.

Figure 8:
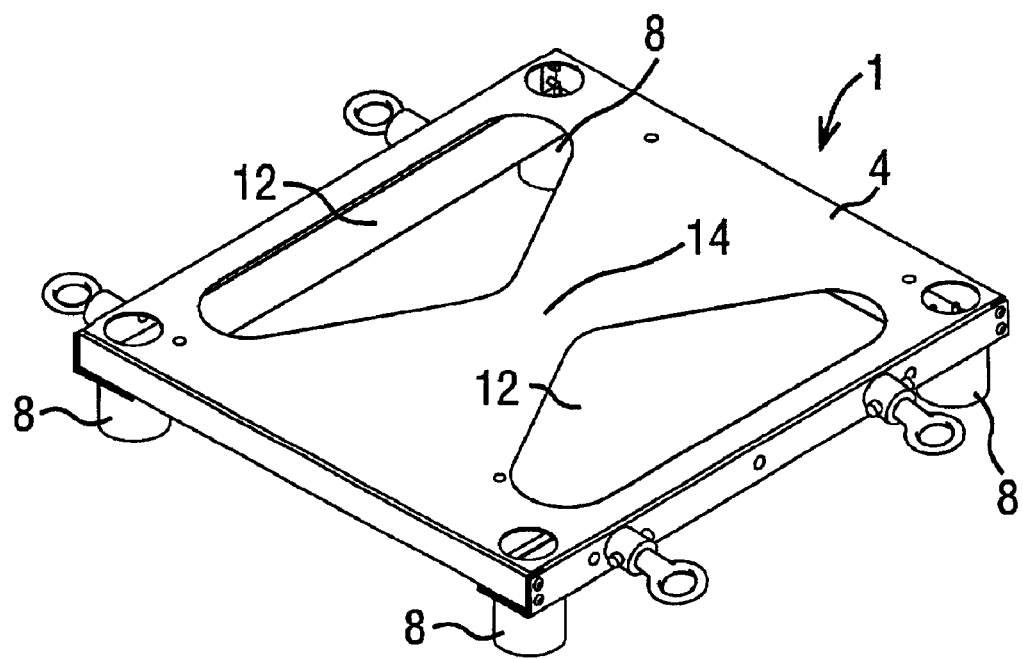
FIG. 8 is an isometric view of a support according to yet another aspect of the invention.

FIG. 8 shows another modification of the invention.

In this modification, four handles are provided, two at each of two opposite sides of the support, that can be used to lift the assembly and the support and which may be rotated in order to release the support from the assembly. The particular mechanism for holding the support and the assembly and for releasing them is not shown.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A support for holding an electronics assembly, which comprises:

a rigid frame;

one or more cushioning elements for protecting the electronics assembly against mechanical shocks during handling;

a plurality of handles to enable the support to be manually lifted; and one or more attachment elements for securing the support to the electronics assembly, wherein said one or more attachment elements are coupled to the frame and coupled to at least one of the plurality of handles;

wherein the handles are movable with respect to the frame to allow the one or more attachment elements to engage or release the electronics assembly.

2. The support as claimed in claim 1, which includes a rigid base that is attached to the one or more cushioning element so that the frame is cushioned from shocks to the base.

3. The support as claimed in claim 1, wherein the handles are located on brackets that hold the one or more attachment elements, wherein the brackets are pivotal with respect to the frame at least to a limited extent, to allow the one or more attachment elements to engage or release the electronics assembly.

4. The support as claimed in claim 1, wherein the frame has a shield at least in a central region thereof, to protect the electronics assembly against impact.

5. A support for holding an electronics assembly, which comprises:

a rigid frame, one or more cushioning elements coupled to the frame for protecting the electronics assembly against mechanical shocks during handling, a rigid base that is attached to the one or more cushioning element so that the frame is cushioned from shocks to the bases, a plurality of handles to enable the support to be manually lifted, and one or more attachment elements for securing the support to the electronics assembly, wherein said one or more attachment elements are coupled to the frame and coupled to at least one of the plurality of handles, wherein the handles are movable with respect to the frame to allow the one or more attachment elements to engage or release the electronics assembly.

6. A support for holding an electronics assembly, comprising:

a rigid frame;

one or more cushioning elements coupled to the frame for protecting the electronics assembly against mechanical shocks during handling;

a plurality of handles to enable the support to be manually lifted; and attachment elements for securing the support to the electronics assembly, the attachment elements being located in the region of the handles;

wherein the handles are movable with respect to the frame; wherein the handles are located on brackets that hold the attachment elements;

wherein the brackets are pivotal with respect to the frame at least to a limited extent, to allow the attachment elements to engage or release the electronics assembly.

7. An electronics assembly that is held on a support which comprises:

a rigid frame, one or more cushioning elements for protecting the electronics assembly against mechanical shocks during handling thereof, and a plurality of handles to enable the support to be manually lifted, wherein the frame is secured to the electronics assembly by means of attachment elements that are located in the region of the handles, wherein the electronics assembly has lugs on which the support is secured, and from which the support depends when the attachment elements are released.

8. The electronics assembly as claimed in claim 7, wherein the handles are movable with respect to the electronics assembly and the frame, and can be moved to disengage the attachment elements from the lugs on the electronics assembly.

9. The electronics assembly as claimed in claim 7, wherein the frame includes a rigid base that is attached to the one or more cushioning element so that the frame is cushioned from shocks to the base.

10. The electronics assembly as claimed in claim 7 which is supported by a pallet to which the support is secured.

* * * * *